(12) United States Patent
Wertz

(10) Patent No.: US 8,333,604 B2
(45) Date of Patent: Dec. 18, 2012

(54) LOADING ARRANGEMENT HAVING ROBUST AND COMPLIANT MOUNTING MEMBER

(75) Inventor: Darrell Lynn Wertz, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 13/069,345

(22) Filed: Mar. 22, 2011

(65) Prior Publication Data

US 2012/0244735 A1    Sep. 27, 2012

(51) Int. Cl.
*H01R 13/62* (2006.01)
(52) U.S. Cl. ...................................................... 439/331
(58) Field of Classification Search .................. 439/330, 439/331, 73
See application file for complete search history.

(56) References Cited

U.S. PATENT DOCUMENTS

| | | | |
|---|---|---|---|
| 7,566,237 B2 * | 7/2009 | Gattuso et al. | 439/331 |
| 7,632,128 B2 | 12/2009 | Lin | |
| 7,658,633 B1 * | 2/2010 | Terhune et al. | 439/331 |
| 7,789,693 B2 | 9/2010 | Liao | |

* cited by examiner

*Primary Examiner* — Javaid Nasri
(74) *Attorney, Agent, or Firm* — Wei Te Chung; Ming Chieh Chang

(57) ABSTRACT

A loading plate includes a substantially rectangular primary plate with a central opening thereof and a pair of sidewalls extending downwardly from opposite edges of the primary plate. The primary plate includes a plurality of depressing portions distributed along the inner periphery of the opening, a pair of opposite mounting holes located at opposite ends thereof, and a pair of slits respectively formed adjacent the mounting holes.

20 Claims, 2 Drawing Sheets

LOADING ARRANGEMENT HAVING ROBUST AND COMPLIANT MOUNTING MEMBER

BACKGROUND OF THE INVENTION

1. Field of the Invention

The present invention relates to a loading arrangement, and more particularly to a loading arrangement having robust and compliant mounting member for fastening a loading plate to a mother board.

2. Description of Related Art

An IC (Integrated Circuit) package is generally coupled with a system via a socket connector mounted on a mother board. A loading plate is usually needed to secure the IC package upon the socket connector. The loading plate may be fastened to the mother board or fastened to socket connector. U.S. Pat. No. 7,632,128 issued to Nan-Hung Lin et al., on Dec. 15, 2009 discloses a loading plate cooperating with a socket connector to mount an IC package. The loading plate is formed by punching and bending a metal sheet and is square in shape. The loading plate is provided with four loading tabs evenly distributed at the periphery of the loading plate for engaging with the IC package. Another four fastening tabs are also provided to extend outwardly from the periphery of the loading plate and engage with screws to fasten the loading plate to a mother board. Both the depressing tabs and the fastening tabs are formed in a cantilever manner, which is likely to result in permanent deformation. Once the permanent deformation occurs, the electrical connection between the IC package and the socket is negatively affected.

In view of the above, an improved loading arrangement is desired to overcome the above-mentioned problem.

SUMMARY OF THE INVENTION

Accordingly, an object of the present invention is to provide a loading arrangement for reliably loading an IC package.

According to one aspect of the present invention there is provided a loading plate which includes a substantially rectangular primary plate with a central opening thereof and a pair of sidewalls extending downwardly from opposite edges of the primary plate. The primary plate includes a plurality of depressing portions distributed along the inner periphery of the opening, a pair of opposite mounting holes located at opposite ends thereof, and a pair of slits respectively formed adjacent the mounting holes.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
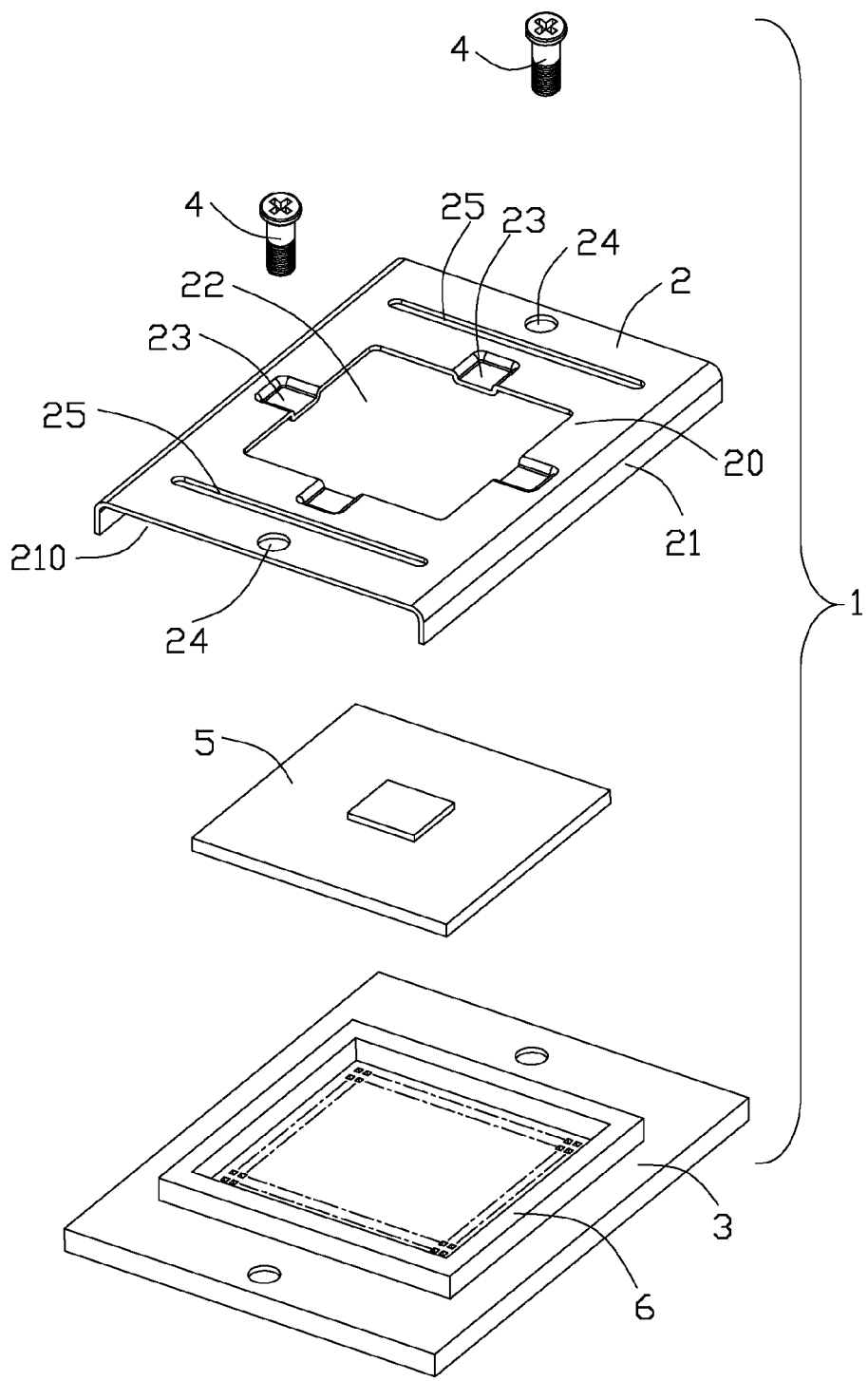
FIG. 1 is an exploded, perspective view of a loading arrangement in accordance with a preferred embodiment of the present invention.
Figure 2:
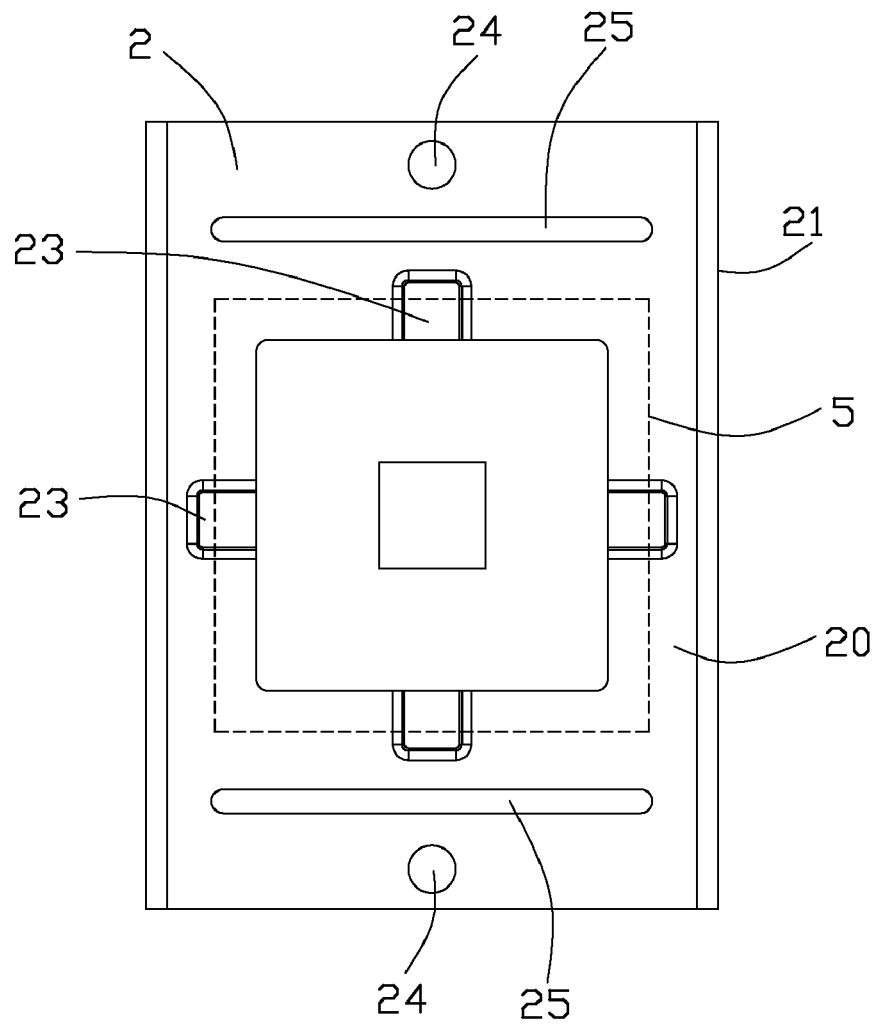
FIG. 2 is top view of a loading plate in accordance with the preferred embodiment of the present invention.

Referring to FIG. 1 and FIG. 2, a loading arrangement 1 made in accordance with the present invention includes a loading plate 2, a mother board 3, and a pair of screws 4 fastening the loading plate 2 to the mother board 3. The loading arrangement 1 depresses an IC package 5 downward upon a socket connector 6 and has the IC package 5 securely retained upon the socket connector 6.

The loading plate 2 is made by punching and bending a metal sheet and includes a primary plate 20 and a pair of sidewalls 21 extending at merely one pair of opposite ends thereof such that the other pair of opposite ends thereof are respectively formed with a essentially n-shaped opening 210, viewing from a horizontal perspective. A central opening 22 is formed from the primary plate 20, with periphery edges thereof are respectively equipped with a depressing portion 23 that recesses downwardly from primary plate 20 by a drawing method to an embossment style. The depressing portion 23 is disposed substantially parallel to the primary plate 20, with majority of its periphery integrally connected to the primary plate 20 while none part of the depressing portion 23 extends into the central opening 22, such that a robust intensity is provided and permanent deformation is avoided. Particularly referring to FIG. 2, when the IC package 5 is engaged with the loading plate 2, the depressing portions 23 are evenly distributed and respectively depress the edges of the IC package 5.

A pair of mounting holes 24 are formed and located at opposite ends of the loading plate 2 in a transverse direction. Because of the upright sidewalls 21 of the loading plate 2, the mounting holes 24 are disposed above the mother board 3 with a certain distance therebetween. The mounting holes 24 are engaged with the screws 4 as to fasten the loading plate 2 to the mother board 3. The screw 4 should be either directly screwed within the mother board 3 or screwed to a back plate (not shown) placed at the bottom of the mother board 3. A pair of longitudinal slits 25 are respectively formed and located adjacent the mounting holes 24 so that the part of the primary plate 20 where the mounting hole 24 is located is provided with proper elasticity and compliance, thus able to keep reliable engagement between the screw 4 and the mounting hole 24. Because the mounting hole 24 is directly formed from the primary plate 20 rather than from a cantilever tab as used in prior art, permanent deformation thereof is avoided while keeping reliable compliance.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A loading plate for being assembled with a printed circuit board, comprising:
    a substantially rectangular primary plate with a central opening thereof, the primary plate having a plurality of depressing portions distributed along the inner periphery of the central opening, a pair of opposite mounting holes located at opposite edges of the primary plate, and a pair of slits respectively formed adjacent the mounting holes; and
    a pair of sidewalls extending downwardly from opposite edges of the primary plate, the mounting holes locating on the upper side of the sidewalls.

2. The loading plate as claimed in claim 1, wherein the depressing portions does not extend into the central opening.

3. The loading plate as claimed in claim 1, wherein the loading plate is mounted on a mother board, the mounting hole is above the mother board with a certain distance therebetween.

4. The loading plate as claimed in claim 1, wherein the depressing portion recesses downwardly from the primary plate and is substantially parallel to the primary plate.

5. The loading plate as claimed in claim 1, wherein the opening has four periphery edges each equips with one said depressing portions that directly engaged with an IC package.

6. The loading plate as claimed in claim 5, wherein each of the slits locates between one of the depressing portions and one of the mounting holes corresponding to the depressing portions and is longer than that of the side edge of the central opening.

7. A loading arrangement, comprising:
a mother board;
a substantially rectangular loading plate mounted upon the mother board and comprising a primary plate and a pair of sidewalls extending at merely one pair of opposite ends thereof such that the other pair of opposite ends thereof are respectively formed with a essentially n-shaped opening, viewing from a horizontal perspective, the primary plate having two mounting holes formed at two opposite ends thereof and disposed above the mother board with a certain distance therebetween; and
a pair of screws extend through the mounting holes respectively and fastening the loading plate to the mother board.

8. The loading arrangement as claimed in claim 7, wherein the primary plate comprises a central opening and a plurality of depressing portions distributed along periphery edges of the opening.

9. The loading arrangement as claimed in claim 8, wherein the opening has four periphery edges each equip with one said depressing portion that directly engaged with an IC package.

10. The loading arrangement as claimed in claim 8, wherein the depressing portion does not extend into the opening.

11. The loading arrangement as claimed in claim 8, wherein the depressing portion recesses downwardly from the primary plate and is substantially parallel to the primary plate.

12. The loading arrangement as claimed in claim 7, wherein the loading plate comprises a pair of sidewall extending downwardly from opposite edges of the primary plate.

13. The loading arrangement as claimed in claim 7, wherein the loading plate comprises a pair of slits respectively formed adjacent the mounting holes which are therefore provided with proper compliance.

14. An electrical assembly comprising:
a printed circuit board;
a socket connector mounted upon the printed circuit board with a plurality of contacts therein;
a receiving cavity defined in the socket connector for receiving an electronic package which is adapted to mechanically and electrically connect to said contacts;
a loading plate defining a rectangular boundary with a central opening to upwardly expose the receiving cavity, a pair of through holes formed in opposite lengthwise end regions of the loading plate within said rectangular boundary; and
a pair of screws fasten the loading plate to the printed circuit board.

15. The electrical assembly as claimed in claim 14, wherein the loading plate forms a plurality of downward embossments around the central opening for downwardly pressing the electronic package which is adapted to be received in the receiving cavity.

16. The electrical assembly as claimed in claim 14, wherein an opening is formed between each of the through holes and the central opening so as to adjust elasticity and compliance of the loading plate around the corresponding through hole where the screw extends.

17. The electrical assembly as claimed in claim 14, wherein the loading plate includes a pair of downward side walls each extending from a corresponding lateral side of the rectangular boundary.

18. The electrical assembly as claimed in claim 17, wherein no downward side walls are formed at the opposite lengthwise end regions.

19. The electrical assembly as claimed in claim 14, wherein said pair of through holes are located above the printed circuit board with a distance equally to a height of the pair of side walls which respectively downwardly extend from two opposite lateral side edges of the load plate.

20. The electrical assembly as claimed in claim 14, wherein the load plate defines a pair of depressing portions for downwardly pressing an electronic package received in the socket connector, and said pair of depressing portions are essentially aligned with the pair of through holes in a lengthwise direction.

* * * * *